United States Patent
Minas et al.

(10) Patent No.: US 6,525,536 B2
(45) Date of Patent: Feb. 25, 2003

(54) COMPACT GRADIENT COIL ASSEMBLY FOR MRI APPARATUS

(75) Inventors: Constantinos Minas, Slingerlands, NY (US); Yuri Lvovsky, Clifton Park, NY (US); Ahmed Kamal Kalafala, Albany, NY (US)

(73) Assignee: Intermagnetics General Corporation, Latham, NY (US)

(*) Notice: Subject to any disclaimer, the term of this patent is extended or adjusted under 35 U.S.C. 154(b) by 0 days.

(21) Appl. No.: 09/767,299

(22) Filed: Jan. 23, 2001

(65) Prior Publication Data

US 2002/0097052 A1 Jul. 25, 2002

(51) Int. Cl.$^7$ .................................................. G01V 3/00
(52) U.S. Cl. ..................... 324/318; 324/319; 324/320
(58) Field of Search ................................ 324/318, 319, 324/320; 335/299

(56) References Cited

U.S. PATENT DOCUMENTS

| | | | |
|---|---|---|---|
| 5,349,297 A | 9/1994 | DeMeester et al. | 324/318 |
| 5,570,021 A | 10/1996 | Dachniwskyj et al. | 324/318 |
| 5,998,998 A | * 12/1999 | Westphat | 324/318 |
| 6,181,227 B1 | * 1/2001 | Schmist et al. | 335/399 |

* cited by examiner

*Primary Examiner*—Edward Lefkowitz
*Assistant Examiner*—Brij B. Shrivastav
(74) *Attorney, Agent, or Firm*—Katten Muchin Zavis Rosenman

(57) ABSTRACT

A cylindrical magnet assembly for use in magnetic resonance imaging apparatus has a radially compact construction which eliminates prior manufacturing steps. Recesses are formed in insulation layers for receiving complimentary shaped bus bars. Because the bus bars are dimensioned to fit flush within the recesses, they do not add to the radial growth of the magnet assembly.

23 Claims, 3 Drawing Sheets

COMPACT GRADIENT COIL ASSEMBLY FOR MRI APPARATUS

BACKGROUND OF THE INVENTION

1. Field of the Invention

The present invention relates in general to laminated cylindrical coils for producing magnetic fields and relates in particular to such apparatus wherein insulated bus bars are inset within grooves formed in the coils.

2. Description of Prior Developments

The manufacture and construction of a gradient coil assembly for use in magnetic resonance imaging (MRI) apparatus can be complicated and costly. A typical gradient coil assembly includes the main coil subassembly which includes three cylindrical main coils known as the x, y and z main coils and the shield coil subassembly which includes corresponding cylindrical shield coils known as the x, y and z shield coils. The entire gradient coil assembly is mounted within the bore of an MRI magnet for producing the accurately controlled intense magnetic fields required to produce MRI images.

The x and y gradient coils can be formed from flat panels which are bent into 90° or 180° arcs and assembled into cylindrical fabrications. Such panel constructions used for the x and y coils are known as "thumb-print" 90° or 180° section panel coils. Each panel includes an electrical conducting layer laminated to a backing layer of insulation which may be of a resin base formulation such as G-10 fiberglass.

In order to properly distribute electrical current to the x and y gradient coils, bus bars are inserted radially between the x and y coils and between y and z coils. This placement of the bus bars takes up space between the x and y gradient coils as well as between the y and z gradient coils. The result is an overall gradient coil assembly having a relatively large radial thickness due to the placement of the bus bars.

When the bus bars are initially mounted to a panel coil, a layer of resinous composite material is generally applied over the entire outer surface of the bus bars and panel coils to form a cylindrical sleeve around the bus bars and their underlying gradient coils. This layer of composite material must be allowed to harden and cure. The time required for curing slows down the magnetic coil manufacturing process.

After the layer of composite material cures, it must be carefully machined to provide a smooth accurate cylindrical surface beneath and within which the bus bars are embedded. The carefully machined surface on the composite resin material is required for maintaining an accurate coaxial alignment between the x, y and z coils. This accurate alignment is needed to produce accurate magnetic field gradients.

The next layer of gradient coil material is then mounted over the machined resinous composite layer. It can be appreciated that the machining of the composite material adds significant time and cost to the fabrication of the gradient coil assembly.

The conventional assembly of the bus bars between the x and y gradient coils and between the y and z gradient coils not only requires significant time and effort, it results in a large diameter coil assembly. This is a drawback, since the end result is an MRI magnet having a smaller central opening. Small openings are considered unfavorably by patients who may experience claustrophobia when positioned in such small openings.

Moreover, if the main gradient coil subassembly and the shield gradient coil subassembly can be made more radially compact, the gradient coil assembly becomes more magnetically efficient insofar as it requires less electrical current to produce the same magnetic field as a more radially enlarged design.

Accordingly, a need exists for a more radially compact gradient coil assembly for an MRI magnet. A further need exists for a gradient coil assembly which eliminates one or more of the time consuming manufacturing steps associated with the fabrication of conventional gradient coils. Yet another need exists for a gradient coil assembly which facilitates the mounting of bus bars between concentric cylindrical gradient coils in an MRI magnet assembly.

SUMMARY OF THE INVENTION

The present invention has been developed to fulfill the needs noted above and therefore has an object the provision of a radially compact gradient coil assembly for use in MRI apparatus.

A further object of the invention is the provision of a bus bar mounting arrangement for mounting bus bars between adjacent concentric coils, such as gradient coils used in MRI apparatus.

Yet another object of the invention is the provision of an improved method of assembling gradient coils such that one or more conventional manufacturing steps are eliminated.

Another object of the invention is the provision of locating pins for facilitating the accurate alignment of consecutive layers of magnet coils, both axially and circumferentially.

These and other objects are met in accordance with the present invention which is directed to a compact gradient coil assembly wherein grooves are machined within the coil backing insulation material to receive electrical bus bars. The bus bars are used to distribute electrical power to the magnetic field generating coils concentrically mounted around one another.

Axial, circumferential, helical or other shaped grooves are machined in the insulating backing material typically provided on the sheet-like panels used to form the coils., These grooves allow the bus bars to be inserted within or inlaid into these recesses cut into the backing material. In this manner, the bus bars do not radially project above or beyond the surface of the backing material but are instead enshrouded within the backing material as opposed to being completely embedded in an overlay of cured adhesive resin. This recessed mounting of the bus bars substantially flush with the surface of the panel backing layer of the overlying panel allows the next adjacent overlying gradient coil to be mounted substantially directly to the surface of the underlying coil without the need for accommodating a radially projecting bus bar of the type necessitated by prior coil assembly constructions.

A particular advantage of this type of bus bar and coil mounting assembly is the reduction in the overall radial thickness of the main coil and shield coil subassemblies. That is, prior designs simply positioned a bus bar on the conductive outer surface of the panel coil and then applied a cylindrical layer of adhesive resin over the bus bar and the underlying panel coil. This layer of resin required time to cure and added to the radial growth of the main and shield coil subassemblies.

Once the resin dried or cured, it had to be carefully machined, as noted above. It can be appreciated that by inserting a bus bar into a groove in the coil backing material, so that the bus bar does not radially project to any significant degree above or beyond the surface of the backing material, a supplemental layer of resin is not needed to form a continuous cylindrical support layer around the radially protruding bus bar and its underlying coil. Such a supplemental resin layer was required in prior panel constructions to provide a continuous cylindrical mounting surface around which the next cylindrical coil was mounted.

By eliminating the supplemental resin layer between adjacent coils, the assembly time of the coil assembly can be reduced. Moreover, the time required for curing the supplemental resin layer can also be eliminated. A significant additional advantage of eliminating the supplemental resin layer is the elimination of the machining step previously required to form an accurate cylindrical support surface on the cured supplemental resin material.

The bus bars may be specially adapted for use with the MRI coil assembly of the present invention by having a layer of insulation provided along the radially inner surface of each bus bar. In this manner, the bus bars are prevented from electrically shorting the current flowing in the coils upon which the bus bars are mounted. Bus bars insulated in accordance with the invention are particularly well suited to the simplified x and y coil construction noted above.

Another feature of the invention is the use of radily-extending positioning pins for axially and circumferentially positioning a y coil over an x coil during their assembly. Such pins facilitate accurate fabrication and alignment of flat panels as they are flexed into accurate segments to form a cylindrical coil.

These and other objects of the invention will become more readily apparent from the following detailed description, taken together with the accompanying drawings.

BRIEF DESCRIPTION OF THE DRAWINGS

In The Drawings.

In the various views of the drawings, like reference characters designate like or similar parts.

DETAILED DESCRIPTION OF THE PREFERRED EMBODIMENT

Figure 1:
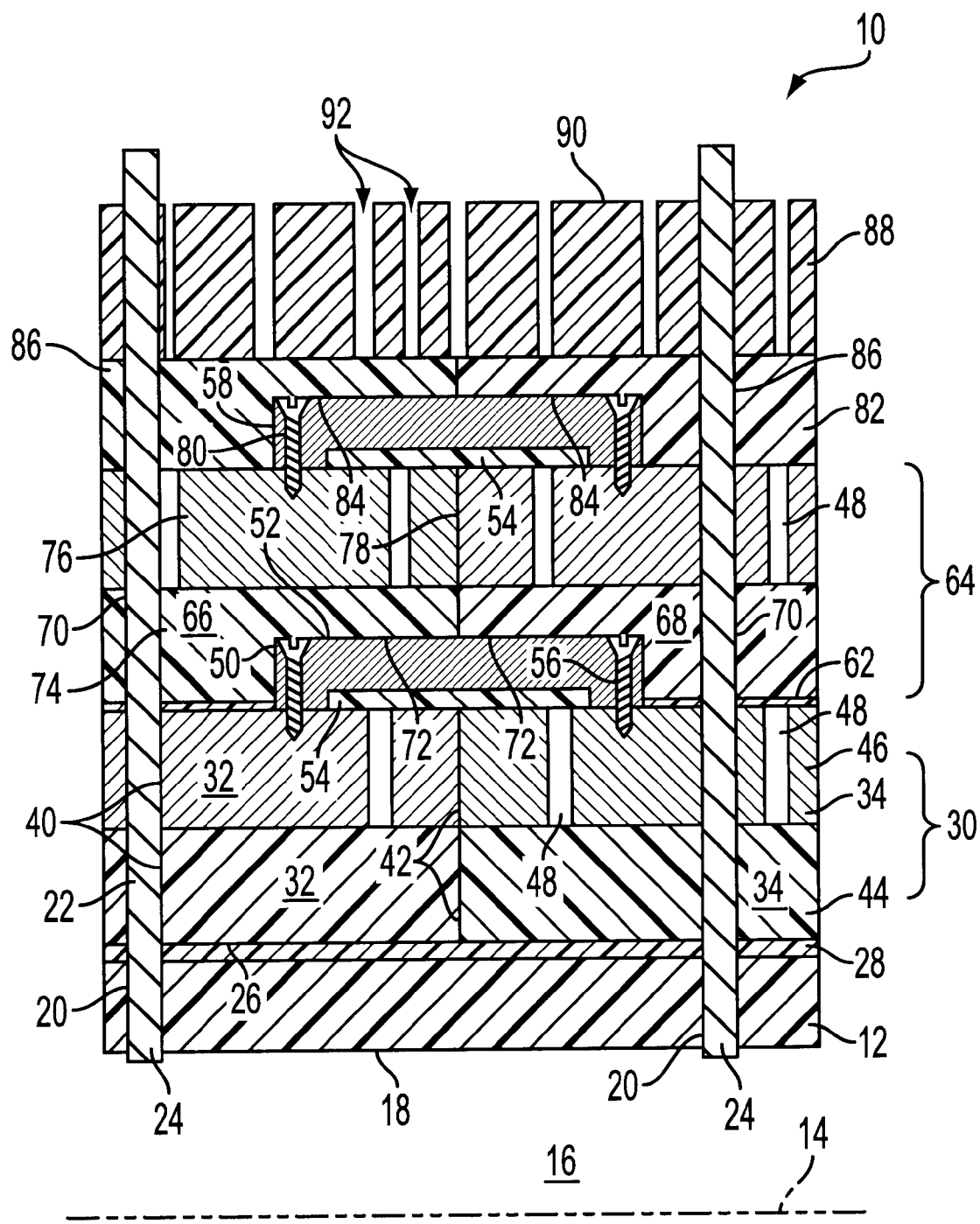
FIG. 1 is a schematic radial sectional view taken through the location of the bus bars in a magnetic coil sub-assembly constructed in accordance with the invention.

The present invention will now be described in conjunction with the drawings, beginning with FIG. 1, which shows a radial section taken through the full axial length of a hollow cylindrical laminated magnet coil assembly 10 constructed in accordance with the invention. The radial dimension or height of FIG. 1 is greatly increased or exaggerated for clarity while the axial dimension or length of FIG. 1 is greatly reduced or compressed. In practice, the length of the magnet assembly of FIG. 1 is, for example, 2 meters while the height of FIG. 1 is a small fraction of that length, for example, less than 100 mm.

The magnet coil assembly 10 is constructed on a cylindrical support tube 12 having a central axis 14. The lower, mirror image of the section through FIG. 1 is not shown. Tube 12 is typically constructed of a wound glass fiber material such as "G10" fiberglass. Resin adhesive is used to fix the fiber material in a permanent cylindrical shape. The open cylindrical area 16 defined by the inner surface 18 of tube 12 provides for an open imaging region within which a patient is typically positioned during MRI procedures.

Once the resin material in tube 12 begins to harden and cure, radial bores or holes 20 are drilled through the fiberglass. Locating and alignment pins 22 are then inserted into the holes 20. Although only two pins 22 are shown in FIG. 1, preferably more are used, such as eight pins circumferentially spaced 90° apart and arranged in four separate pairs as the pair shown in FIG. 1.

Locating pins 22 can have threaded end portions 24 which can be screwed into bores 20 for added retention and rigidity. Pins 22 serve to axially and circumferentially locate, align and accurately position the overlying laminations as discussed below.

Once the cylinder 12 fully cures, its outer cylindrical surface 26 is carefully machined to a predetermined outer diameter as calculated for proper coil performance. After machining, a thin layer of resin, epoxy or other adhesive 28 is evenly applied over the machined surface 26.

A main x-coil 30 in the form of a thin, flat rectangular sheet is then assembled around the tube 12. Although the invention will be described using main coils as an example, x and y shield coils are also constructed using the same procedure and materials.

Figure 3:
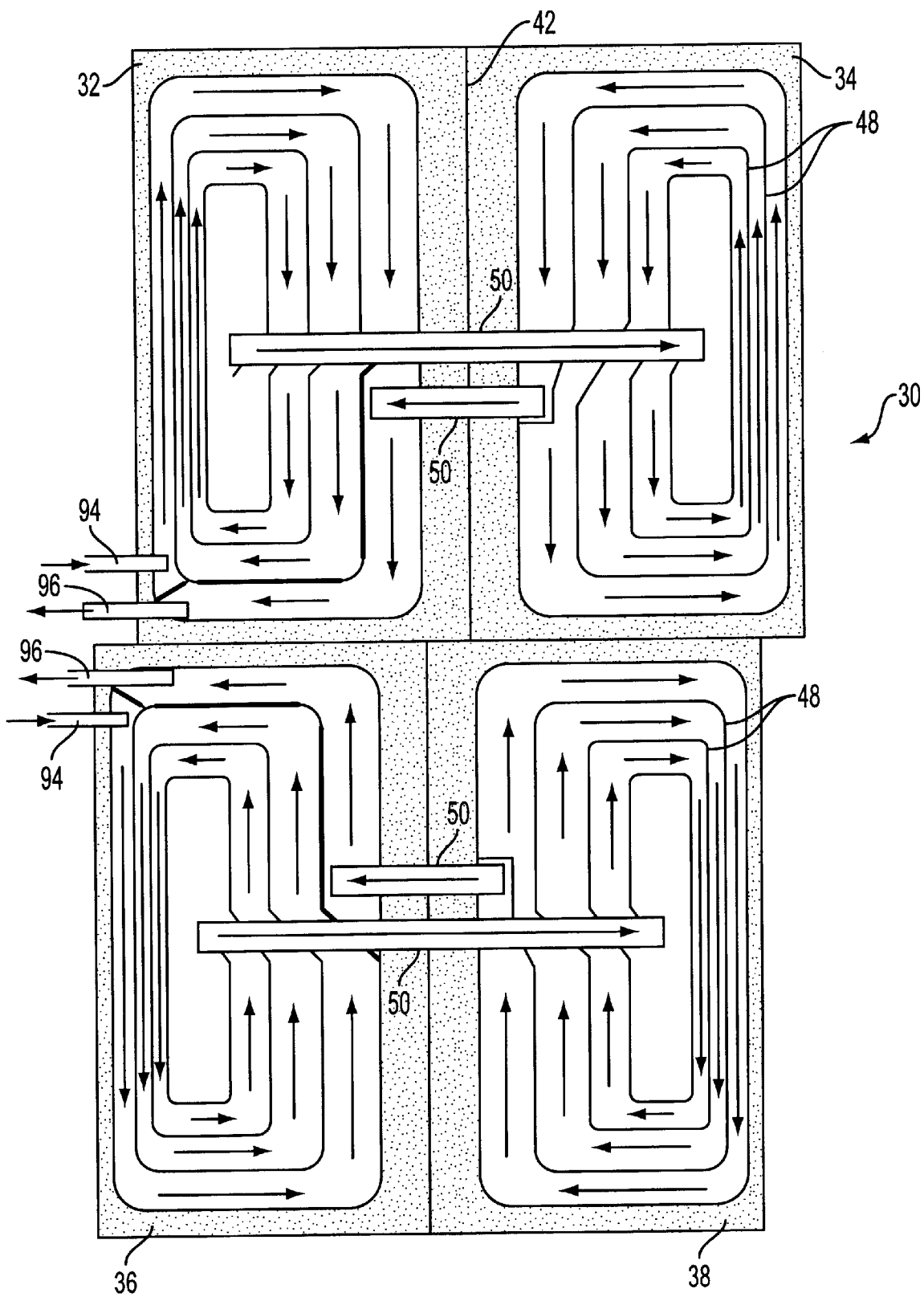
FIG. 3 is a schematic top plan view of a main x-coil constructed from four panels interconnected with bus bars in accordance with the invention. The panels are shown laid out flat prior to being curled into a cylinder.

The main x-coil 30 is, in this example, actually formed from four separate flat o rectangular panels 32, 34, 36, 38 (FIG. 3). Each panel includes one or more positioning bores 40 for receiving the respective guide pins 22. The individual panels are thin and flexible and are easily bent, curved and curled into 180° arcs. The panels are fitted over the guide pins 22 and deformed around the tube 12. The adhesive resin 28, which is typically applied to tube 12 in the manner of paint, securely holds the individual panels in their semi-cylindrical flexed shape.

As further seen in FIG. 1, two panels 32, 34 are abutted end to end along an interface or butt joint 42. Each panel is provided in the form of a laminated sheet having an electrical insulation layer or backing layer 44 and an electrical conductive layer 46. The layer 44 may be formed of a glass or resin material and the layer 46 is typically formed of copper. Spiral grooves 48 are cut into and through the conductive layer 44 in a known manner to form an electrically conductive circuit pattern similar to a thumb print.

For this reason, panels 32, 34, 36 and 38 are commonly referred to as thumb-print panel coils, and in this case 180° thumb-print panel coils. Of course, one 360° panel, four 90° panels or any other suitable number and arrangement of panel coils can be used to construct a main coil or shield coil in accordance with the invention.

Figure 2:
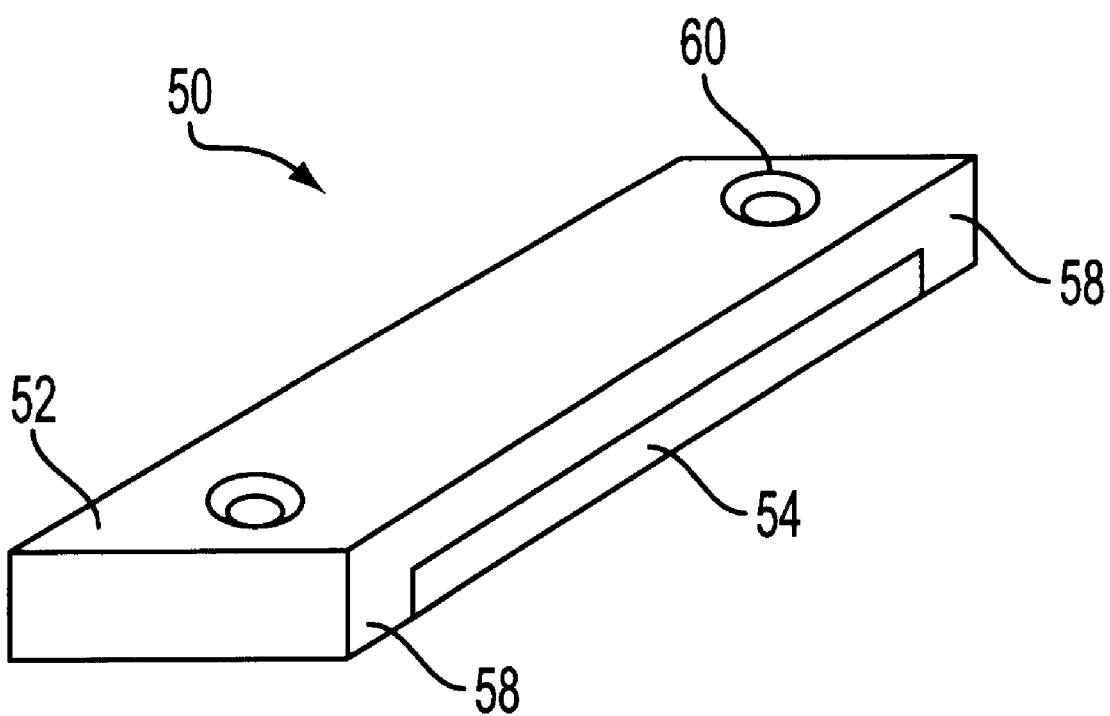
FIG. 2 is a perspective view of a bus bar constructed in accordance with the invention.

At this point, one or more bus bars 50 are assembled across the butt joint 42 so as to electrically connect each pair of axially abutting panels 32, 34 and 36, 38. As seen in FIG. 2, each bus bar has an electrically conductive portion 52 and an electrically insulating portion 54. The bus bars 50 can be rigidly attached to the panels of the main x coil 30 with recessed fasteners such as brass screws or bolts 56.

The bus bar conductive portions 52 can be formed of copper and the insulating portions 54 can be formed of an epoxy composite or glass based material such as fiberglass. As further seen in FIG. 2, each bus bar has a pair of upstanding end portions or legs 58 separated by a central insulated portion 60. The insulated portion prevents the bus bars from electrically shorting the current flowing through the spiral paths cut into the respective panels. Countersunk bores 60 may be formed through the legs 58 to receive the fasteners 56.

A thin layer of adhesive 62 is next applied over the exposed surface of the main x coil 30. The main y coil 64 is then assembled over the main x coil 30. In the same manner as described above with respect to the main x coil 30, the main y coil 64 is fabricated in this example from four flat flexible panels arranged similarly to those panels shown in FIG. 3, i.e., four 180° thumb print y panel coils, two of which 66, 68 are shown in FIG. 1.

Each y panel 66, 68 is formed with one or more positioning bores 70 for receiving the positioning pins 22 and accurately locating the panels axially and circumferentially with respect to each other and with respect to the main x coil 30. The main y coil is constructed and assembled similar to the main x coil except for the provision of preformed recesses or pockets 72 formed in the panel coils 66, 68.

The recesses 72 are formed, or cut, such as by machining grooves into the insulation or backing layers 74 when the panel coils are laid out flat, prior to being bent or curled. This greatly facilitates the formation of the recesses. The recesses 72 are cut deep enough into the backing layers 74 to fully receive the complimentary shaped bus bars 50. In this manner, the presence of the bus bars does not increase the radial separation between the x and y main coils 30, 64.

Because the bus bars 50 do not cause any radial separation between the main x and y coils, a magnet designer can design the spacing between the electrically conductive portions 46, 76 of the respective x and y main coils substantially equal to the radial thickness of the backing layer 74 of the main coil. The thickness of the adhesive layer 62 is negligible.

This spacing between the conductive portions provides a design advantage in that additional insulation material is not required between the main x and y coils for the purpose of obtaining a desired radial spacing with respect to the production and interaction of magnetic fields. This simplifies the design and reduces manufacturing time, effort and expense. That is, the magnet designer can design the spacing between the conductive portions of the x and y main coils to be equal to the standard thickness of commercially available backing layers provided on the panel coils.

Once the many coil 64 is assembled over the main x coil 30, bus bars 80 are connected to the panel coils 66, 68 across butt joint 78. Fasteners such as brass screws 56 may be screwed through the legs 58 of the bus bars 80, as described above, to anchor the bus bars 80 on the conductive portions 76 of the main y coil 64. The insulation 54 on the underside or radially inner surface of bus bar 80 prevents electrical shorting of the respective 180° thumb print panel coils 66, 68.

At this stage in the construction of the magnet assembly 10, an outer layer of composite insulation material 82, such as "pre-preg" material is applied over the conductive portion 76 of the main y coil and over the bus bar 80. Pre-preg material is an uncured composite material, typically in the form of glass, carbon or other fiber which is wetted with a resin such as epoxy. Pre-preg is available in flexible sheets and is kept refrigerated below its curing temperature until it is needed.

The pre-preg sheets are warmed to room temperature, and are manually placed over the main y coil and its bus bars and allowed to cure. After the pre-preg sheets cure, they form a solid composite structure.

An important feature of the invention is the forming or cutting of recesses 84 into the pre-preg or other electrical insulating material 82 in its pre-cured condition when the material is laid out in a planar configuration prior to its application over the main y coil 64. Recesses or pockets 84 are dimensioned to fully compliment and fully receive the bus bars 80 such that the insulation layer 82 directly contacts the outer surface of the electrically conductive portion 76 of the main y coil 64 without any obstruction or interference with or from the bus bars 80. Alignment bores 86 are drilled or punched through the pre-preg material to receive the alignment pins 22.

By having the recesses 84 receive and radially envelope bus bars 80, the radial separation between the insulation material 82 and the main y coil is minimized. This provides the significant design and operating benefits noted above.

The next step in the manufacture of the magnet assembly 10 is the winding of a layer of glass material 88, such as "G10" fiberglass, along with an adhesive, over the insulation layer 82. The fiberglass material is wound under maximum tension in order to apply radially compression to the insulation layer 82.

Once the wound glass material 88 cures, its outer diameter 90 is machined as required. Spiral grooves 92 are then machined into the glass material 88 for receiving the windings of a main z coil. A thin layer of adhesive resin is applied to the grooves 98 and a z coil wire is then wound into grooves 92 in a known fashion. At this point, the same set of steps can be used to assemble the x, y and z shield coils, as the invention is equally applicable to constructing shield coils.

Details of the four 180° thumb print panel coils 32, 34, 36 and 38 which together form a main x coil such as the main x coil 30 are shown schematically in FIG. 3. The directional arrows represent the direction of current flow through the bus bars 50 and through the panel coils. Electric current flows through the panels via input leads 94 and output leads 96.

It can be appreciated that the four panel coils 32, 34, 36 and 38 are shown in FIG. 3 as being laid out on a flat surface. In practice, the panel coils are rolled into a tube from the top of FIG. 3 to the bottom around the cylindrical tube 12 of FIG. 1.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

For example, the concept of inserting bus bars into performed grooves or recesses in the backing material of one or more layers of a gradient coil can also be readily applied to flat gradient magnet assemblies as compared to the cylindrical panels. In this case, the sectional view in FIG. 1 is taken through a flat planar stack of magnet coil layers forming a parallepipedic assembly. Curved, arcuate or other shaped gradient magnet assemblies are also within the scope of the invention.

Another variation of the invention includes varying the sequence and locations of the individual magnet coils. In the example discussed above, the main coil subassembly was ordered in the sequence of x, y and z coils and the shield coil subassembly was ordered in the coil sequence of z, x, y. However, any sequence for either the main or shield coil subassemblies may be used, such as a y, x, z sequence for the main coil subassembly.

Moreover, the invention covers not only the combination of main and shield coil subassemblies, but also the insertion of bus bars into preformed grooves in an unshielded gradient coil assembly which includes a main coil subassembly, but doe not include a shield coil subassembly.

What is claimed is:

1. A magnetic coil assembly, comprising:
   a cylindrical support tube;
   a first coil comprising at least two panels having an electrically conductive portion surrounding said support tube;
   a second coil surrounding and spaced radially from the first coil, the second coil comprising a second coil electrical insulation layer and a second coil electrical conductive layer, the second coil electrical insulation layer having a recess formed therein; and
   a first bus bar disposed within said recess and in electrical conducting contact with said electrically conductive portion of at least two panels of the first coil.

2. The assembly of claim 1, wherein the second coil electrical insulation layer comprises a radial thickness substantially equal to the radial spacing between said electrically conductive portion of the first coil and the second coil electrical conductive layer.

3. The assembly of claim 1, wherein said first bus bar comprises an electrically conductive bus portion and an electrically insulating bus portion.

4. The assembly of claim 1, where the second coil comprises at least two panels and the assembly further comprises an outer insulation layer surrounding the second coil, said outer insulation layer having an inner recess formed therein, and a second bus bar disposed in said inner recess and in electrical conducting contact with the electrically conductive layer of at least two panels of the second coil.

5. The assembly of claim 4, wherein said outer insulation layer comprises a pre-preg material.

6. The assembly of claim 1, further comprising an alignment pin extending radially through the first coil and the second coil.

7. The assembly of claim 6, wherein the first coil and the second coil each have a bore formed therein receiving said alignment pin.

8. The assembly of claim 1, wherein the first coil comprises a first main coil and the second coil comprises a second main coil.

9. The assembly of claim 1, wherein the first coil comprises a first shield coil and the second coil comprises a second shield coil.

10. The assembly of claim 1, wherein said first bus bar comprises a pair of spaced apart legs projecting from said electrically conductive bus portion.

11. The assembly of claim 10, wherein said electrically insulating bus portion is located between said pair of spaced apart legs.

12. The assembly of claim 1, wherein said first bus bar has a predetermined shape and wherein said recess compliments the shape of said first bus bar such that said first bus bar is substantially enshrouded within said recess and aligned flush with a surface portion of the second coil electrical insulation layer surrounding said recess.

13. A cylindrical magnetic coil assembly for use in an MRI magnet, comprising;
    a first coil comprising at least two thumb print panels;
    a second coil surrounding and spaced radially from the first coil, the second coil comprising an integral electrical insulation layer having a recess formed therein; and
    a first bus bar disposed in said recess and electrically connecting at least two thumb print panels.

14. The assembly of claim 13, further comprising a locating pin extending radially through the first coil and the second coil.

15. The assembly of claim 13, wherein the second coil is bonded directly to the first coil.

16. The assembly of claim 1, where the second coil comprises at least two panels and the assembly further comprises an outer cylindrical insulation layer surrounding the second coil, and having a pocket formed therein, and a second bus bar disposed in said pocket and in electrical conducting contact with the electrically conductive layer of at least two panels of the second coil.

17. The assembly of claim 16, wherein the second coil comprises at least two thumb print panels and wherein said second bus bar electrically connects the at least two thumb print panels.

18. The assembly of claim 13, wherein the at least two thumb print panels are abutted against one another along a butt joint and wherein said first bus bar comprises an insulation portion extending across said butt joint.

19. A layered magnetic assembly, comprising:
    a support member;
    a multi-panel first layer of a layered coil assembly having a first electrical insulation portion and a first electrically conductive portion supported on said support member;
    a second layer of a layered coil assembly layered with said first layer, said second layer comprising a second electrical insulation layer and a second electrical conductive layer, the electrical conductive portion spaced apart form said electrically conductive portion of said fist layer, said electrical insulation portion having a recess formed therein; and
    a first bus bar disposed within said recess and in electrical conducting contact with said electrically conductive portion of at least two panels of said multi-panel first layer.

20. The assembly of claim 19 wherein said second magnet electrical insulation layer comprises a thickness substantially equal to the spacing between said electrically conductive portion of said first layer and said electrical conductive layer of said second layer.

21. The assembly of claim 19, where the second electrical conductive layer comprises at least two panels and the assembly further comprises an outer insulation layer surrounding said second layer, said outer insulation layer having an inner recess formed therein, and a second bus bar disposed in said inner recess and in electrical conducting contact with the electrically conductive layer of at least two panels of the second coil.

22. The assembly of claim 19, further comprising an outer insulation layer surrounding said second layer, said outer insulation layer having an inner recess formed therein, and a second bus bar disposed in said inner recess.

23. The assembly of claim 19, further comprising an alignment pin extending through said first and second layers.

* * * * *